United States Patent [19]
Tsuruta

[11] Patent Number: 5,311,049
[45] Date of Patent: May 10, 1994

[54] NON-VOLATILE SEMICONDUCTOR MEMORY WITH OUTER DRAIN DIFFUSION LAYER

[75] Inventor: Masataka Tsuruta, Kyoto, Japan

[73] Assignee: Rohm Co., Ltd., Kyoto, Japan

[21] Appl. No.: 959,720

[22] Filed: Oct. 13, 1992

[30] Foreign Application Priority Data

Oct. 17, 1991 [JP] Japan ................... 3-297907

[51] Int. Cl.$^5$ .......................................... H01L 29/78
[52] U.S. Cl. ................... 257/324; 257/326; 257/335; 257/411; 365/185
[58] Field of Search .............. 257/296, 410, 411, 335, 257/336, 408, 390, 391, 324, 326; 365/185

[56] References Cited

U.S. PATENT DOCUMENTS

| | | | |
|---|---|---|---|
| 4,019,198 | 4/1977 | Endo et al. | 257/326 |
| 4,630,086 | 12/1986 | Sato et al. | 365/185 X |
| 4,943,836 | 7/1990 | Mori | 257/324 X |
| 5,079,611 | 1/1992 | Ikeda et al. | 257/390 |

FOREIGN PATENT DOCUMENTS

| | | | |
|---|---|---|---|
| 52-38841 | 3/1977 | Japan | 257/335 |
| 54-138381 | 10/1979 | Japan | 257/335 |
| 55-99764 | 7/1980 | Japan | 257/335 |

Primary Examiner—William Mintel
Attorney, Agent, or Firm—Brumbauch, Graves, Donohue & Raymond

[57] ABSTRACT

A non-volatile semiconductor memory wherein in a semiconductor substrate at both sides of a gate structure, a source diffusion layer and drain diffusion layer having an opposite conductivity type impurity to that of the substrate are provided with a high impurity concentration and a threshold value of a transistor is changed by holding charges in an insulating film in the gate structure, an outer diffusion layer having the same conductivity type impurity as that of the substrate and the impurity concentration higher than that of the substrate intervenes between the drain diffusion layer and the substrate.

1 Claim, 5 Drawing Sheets

NON-VOLATILE SEMICONDUCTOR MEMORY WITH OUTER DRAIN DIFFUSION LAYER

BACKGROUND OF THE INVENTION

The present invention relates to a non-volatile semiconductor memory in which a threshold value of a transistor is changed by holding charges in an insulating film in the gate structure.

Conventionally, such a non-volatile semiconductor memory, for example, an M O N O S (Metal-Oxide-Nitride-Oxide-Semiconductor) element has been known. The structure of the memory will be explained below the reference to FIG. 5. The M O N O S element shown in FIG. 5 includes a gate structure in which a tunnelling oxide film 2 of a thin silicon oxide film, a silicon nitride film 3 hereinafter referred to as merely nitride film, a silicon oxide film 4 hereinafter referred to as a top oxide film and a gate electrode 5 which is conducting layer of an N+ polysilicon layer, etc., are stacked in that order on a P type silicon substrate 1.

The writing of data in M O N O S element is carried out as follows. When a source S is grounded and a positive voltage is applied to the gate G and the drain D (voltage to the gate G is a little higher than to the drain D), respectively, a large electric field is generated near the drain diffusion layer 7. Consequently, electrons in the channel region are accelerated and a charge consisting of a number of electrons (hot electrons) having a high energy is generated. A part of the hot electron charge is drawn into the drain diffusion layer 7. Nevertheless, another part thereof is drawn into the nitride film 3 by tunnelling through the oxide film 2 and is locally held in the nitride film 3, which results in a state in which a threshold value is increased, namely, a state in which data are written is obtained.

The erasing of data from the M O N O S element is carried out as follows. When the source S is grounded, a negative voltage is applied to the gate G and a positive voltage is applied to the drain D, respectively, so that the bending of the energy band becomes large just below the gate on the surface of the drain diffusion layer 7, namely, and the tunnelling effect between bands is generated and holes (avalanche hot holes) are generated. A part of the charge of generated holes becomes a substrate current. Nevertheless, another part thereof is accelerated by the electric field just below the gate to be injected into the nitride film 3. Consequently, the negative charge held in the nitride film 3 is cancelled and the threshold value is reduced. In turn, a number of holes are generally injected into the nitride film 3 to provide a larger charge than the writing negative charge so that a so-called over erase state is generated. However, the residual charge of holes in the nitride film 3 is locally held at the drain side of the nitride film 3. Thus, the channel conduction between the source S and the drain D does not occur.

Reading of data from the M O N O S element is carried out by grounding the source S and applying a lower positive voltage to the gate G and the drain D than in the writing of the data. In this case, the voltage applied to the gate G is at a higher level. When the data is written, the channel from the source different layer 6 does not reach the drain diffusion layer 7 because of the influence of the negative charge held in the nitride film 3. Therefore, a state in which current does not flow between the source S and the drain D (a state in which the threshold value is increased) is obtained. Namely, 1 can be read. In a case where data is not written (erase), a state in which a channel is formed between the source diffusion layer 6 and the drain diffusion layer 7 and current flows (a state in which the threshold value is reduced) is obtained. Namely, O can be read.

Conventional memory devices having such structure, however, have the following problems.

The conventional problems will be explained with reference to FIG. 6. FIG. 6 is a diagram of a memory device in which the M O N O S elements of the type shown in FIG. 5 are connected in a matrix. In FIG. 6, n and n−1 are word lines connected to the gate G of each element, m−1, m, and m+1 are bit lines connected to the drain D of each element. The source S of each element is grounded. When the word line n and the bit line m are held at a high voltage level to write data into the element M1, negative charges are stored in the nitride film in the gate dielectric of the element M1 as mentioned above.

On the other hand, since in the element M2, a low level voltage is applied to the gate G and the high level voltage is applied to the drain D, a comparatively large electric field is generated near the drain and negative charges stored in the nitride film 3 are drawn into the drain or, on the contrary, a state in which the written data is disturbed (drain wring disturbance) is sometimes generated by the fact that the holes generated near the drain are injected into the nitride film 3.

Further, in the elements M3 and M4, since the high level voltage is applied to the gate G, a state in which negative charges stored in the nitride film 3 are drawn into the word line n through the gate electrode 5 (gate writing disturbance) is sometimes generated in the element M3 and in turn, an error writing problem may be generated in the element M4 because negative charges in the channel region are injected into the nitride film 3.

Additionally, when the channel length becomes short by miniaturization of the element and a high level voltage is applied to the drain D, the depletion layer extending from the drain diffusion layer 7 reaches the source diffusion layer 6. Thus, the punch through current is increased and a reading error may be generated.

SUMMARY OF THE INVENTION

The present invention was made view of the above-mentioned situations. An object of the present invention is to provide a non-volatile semiconductor memory in which the above-mentioned disturbance phenomena error writing can be avoided and the increase of the punch through current due to the miniaturization of the element can be prevented.

The present invention has the following structure to attain the object.

Namely, in a non-volatile semiconductor memory wherein in a semiconductor substrate at both sides of a gate structure, a source diffusion layer and a drain diffusion layer having an opposite conducting type impurity to that of the substrate are provided with a high impurity concentration and a threshold value of a transistor is changed by holding charges in an insulating film in the gate structure, an outer diffusion layer having the same conductivity type impurity as that of the substrate and the impurity concentration higher than that of the substrate intervenes between the drain diffusion layer and the substrate.

According to the present invention, since between a drain diffusion layer having an opposite type impurity to a substrate and high impurity concentration and the substrate, an outer diffusion layer having the same conducting type impurity as that of the substrate and the impurity concentration higher than that of the substrate is caused to intervene, when voltage is applied to a drain at the writing of data or erasing thereof, the space charge density is increased in the contact portion of the drain diffusion layer and the outer diffusion layer. Therefore, the electric field is concentrated near the drain to increase the acceleration of electrons and hot electrons and hot holes are effectively generated which can be injected into the insulating film. Namely, when the same amount of hot electrons and hot holes are generated, the voltage to be applied to the gate and the drain can be set at a low level. Thus, the writing disturbance phenomena and the error writing is not easily generated at a non-selective device.

Further, since the outer diffusion layer of the drain has a high impurity concentration, the depletion layer generated in the contact portion of the drain diffusion layer and the outer diffusion layer when voltage is applied to the drain, is more difficult to be extended to the direction of the outer diffusion layer having a high impurity concentration (i.e., the source direction) than in a case where the drain diffusion layer is directly in contact with the substrate. Therefore, even though the channel length becomes short, the source is not connected to the drain by the depletion layer and the generation of the punch through current can be prevented.

DETAILED DESCRIPTION OF THE INVENTION

One embodiment of the present invention will be described below with reference to drawings.

Figure 1:
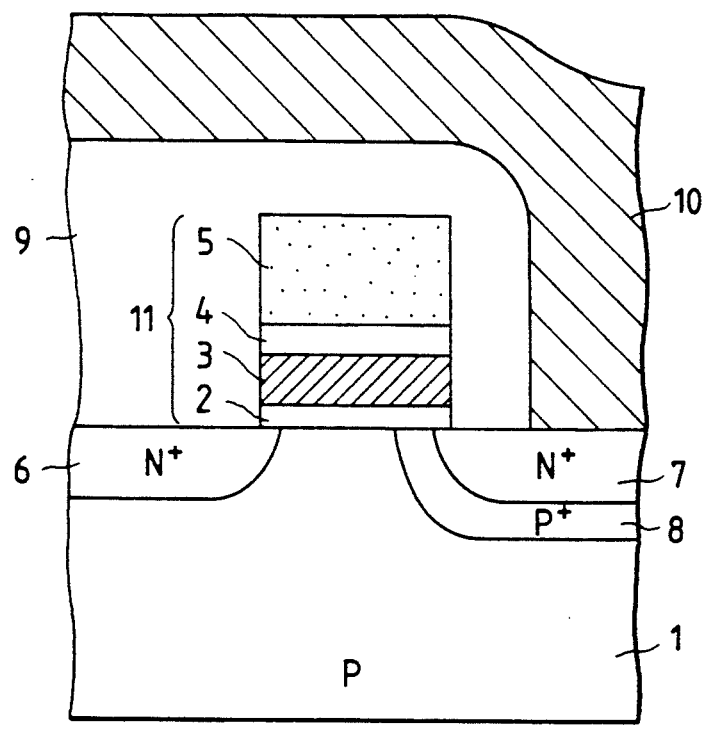
FIG. 1 is a cross-sectional view showing a structure of an M O N O S element according to one embodiment of the present invention.
Figure 5:
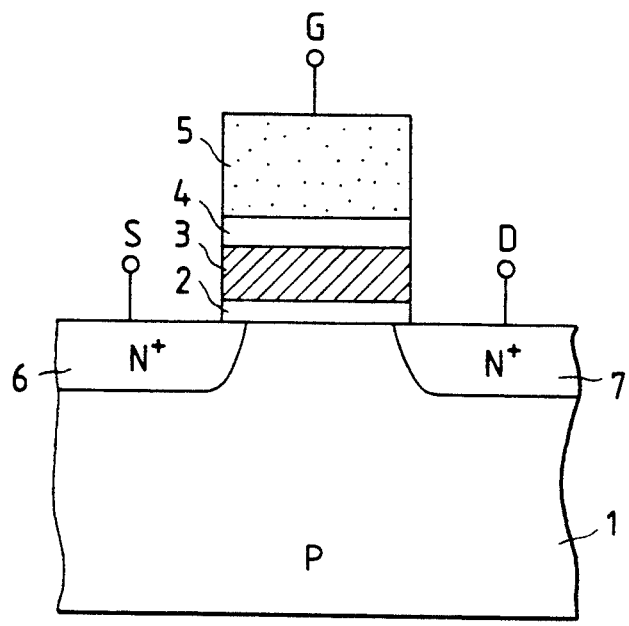
FIG. 5 is a cross sectional view showing a structure of a conventional M O N O S element.
Figure 6:
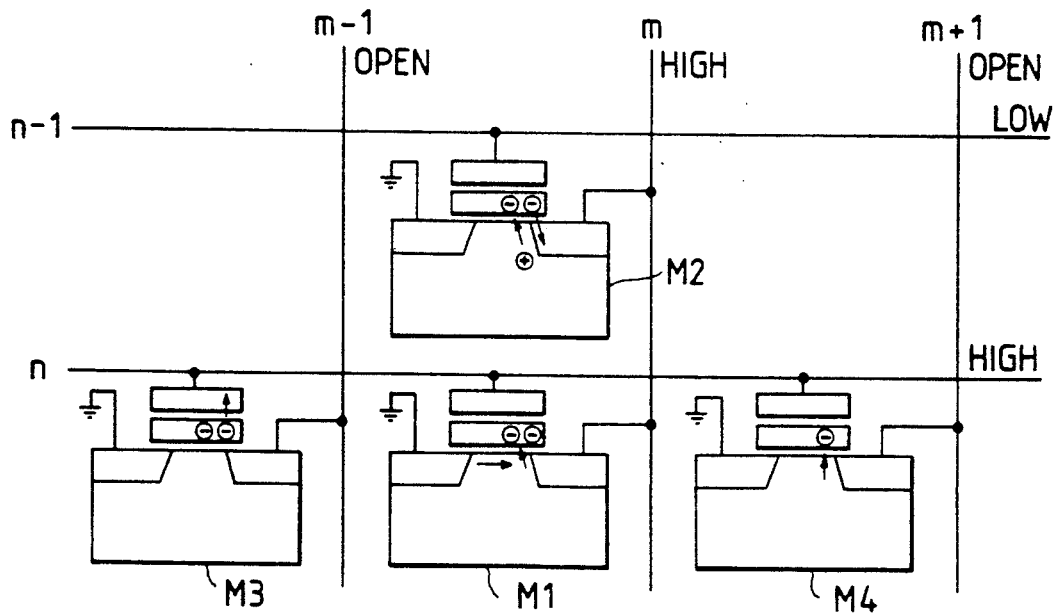
FIG. 6 is a view explaining problems of a conventional device.

FIG. 1 is a cross sectional view showing a structure of a M O N O S element according to one embodiment of the present invention. The M O N O S element according to the embodiment has the same type gate structure as in the conventional element shown in FIG. 5. Namely, a tunnelling oxide film 2, a nitride film 3, a top oxide film 4 and a gate electrode 5 are stacked on a silicon substrate 1 in that order. The stacked structure is referred to as a dielectric gate structure 11 in the following explanation. In this case, the tunnelling oxide film 2 is set to 20 to 60 Å, the nitride film 3 is set to 60 to 120 Å, and the top oxide film 4 is set to 40 to 80 Å. At both sides of the dielectric gate structure 11, a source diffusion layer 6 and a drain diffusion layer 7 which are an N+ region are formed. The feature of the present embodiment resides in that a P+ outer diffusion layer 8 having the same conducting type impurity as that of the silicon substrate 1 and a higher impurity concentration than in the silicon substrate 1 is caused to intervene between the drain diffusion layer 7 and the silicon substrate 1. In FIG. 1, the reference numeral 9 designates an intervening insulating layer and the numeral 10 designates a drain electrode.

As explained above, when voltage is applied to the drain during the data writing and the data erasing, the space charge density of the high concentration PN contract portion of the drain diffusion layer 7 and the P outer diffusion layer 8 is increased by causing the P+ outer diffusion layer 8 to intervene between the drain diffusion layer 7 and the silicon substrate 1 so that the electric field is concentrated at the PN contact portion. Thus, since electrons in the channel region are rapidly accelerated near the drain, hot electrons and hot holes are effectively generated and these charges are promptly injected into the nitride film layer 3. Further, by causing the P+ outer diffusion layer 8 to intervene, the depletion layer in the PN contact portion of the drain diffusion layer 7 and in the P+ outer diffusion layer 8 becomes more difficult to be extended to the source side than in a case where the drain diffusion layer 7 is directly brought into contact with the silicon substrate 1. Thus, even in a short channel device, the source is not connected to the drain by the depletion layer and the generation of the punch through current can be prevented.

The production method of the M O N O S element according to the present embodiment will be explained with reference to FIGS. 2 to 4 below. In this case, a production method of a memory device in which M O N O S elements are connected in a matrix will be shown.

Figure 2A:
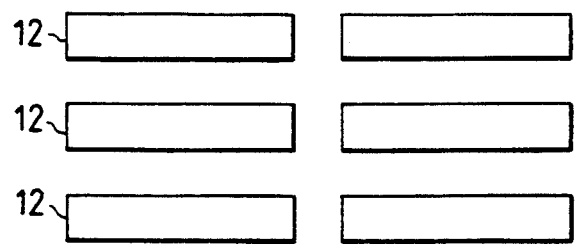
FIGS. 2(a) to 2(d) are explanatory views of a production method of a memory device using the M O N O S element according to the embodiment.

In FIG. 2(a), a field oxide film is grown on the silicon substrate 1 to form isolation regions 12.

Figure 2B:
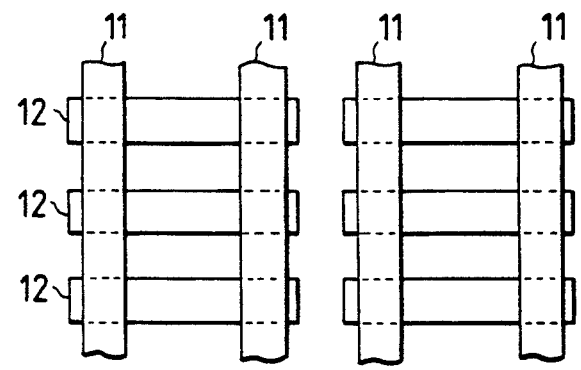

In FIG. 2(b), a tunnelling oxide film 2, a nitride film 3, a top oxide film 4 and a gate electrode 5 are stacked in the order on the silicon substrate 1 in which the isolation region 12 is formed, and a patterning is carried out by a photoetching process to form band shaped dielectric gate structures 11.

Figure 2C:
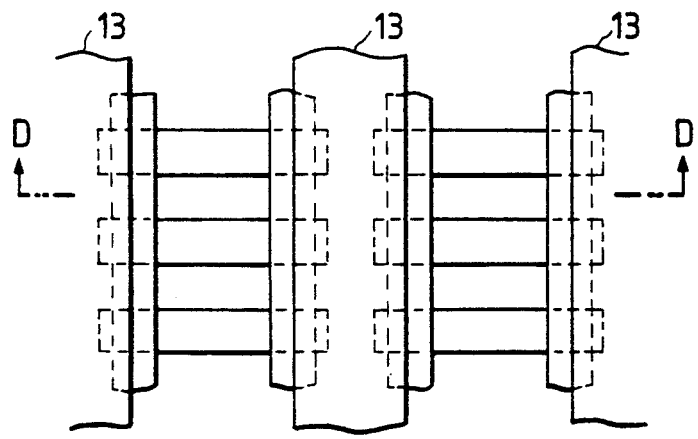
Figure 2D:
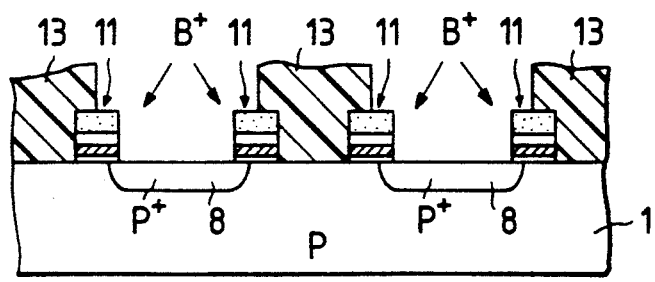

In FIG. 2(c) and FIG. 2(d) which is a cross sectional view taken along the line D—D of FIG. 2(c), a source region is masked by a photoresist 13 and boron (B+) is ion-implanted to a drain region at a large tilt angle to form the P+ outer diffusion layer 8 with self-alignment. The reason why the boron is ion-implanted at the large tilt angle is the fact that a lateral expansion of the P+ outer diffusion layer 8 is promoted so that the P type high concentration impurity layer is formed just below the tunnelling oxide film 2 near the drain. When boron is vertically ion-implanted into the silicon substrate 1, the redistribution of the impurity occurs at a heat treatment and the P type boron concentration is reduced at the surface (near the interface for the tunnelling oxide film 2) with result that the amount of the N type arsenic which is subsequently ion-implanted, possibly becomes larger than that of the boron.

Figure 3A:
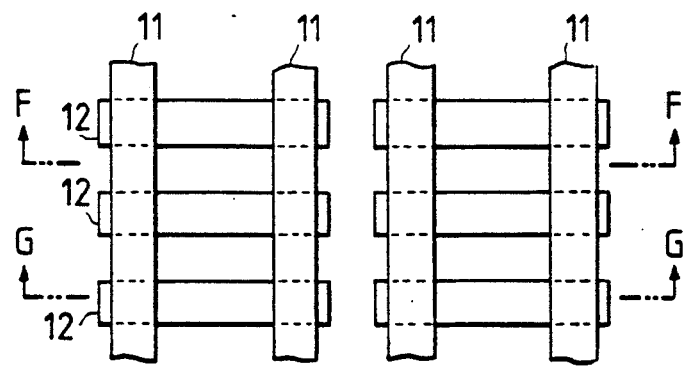
FIGS. 3(e) to 3(h) are explanatory views of a production method of a memory device using the M O N O S element according to the embodiment.
Figure 3B:
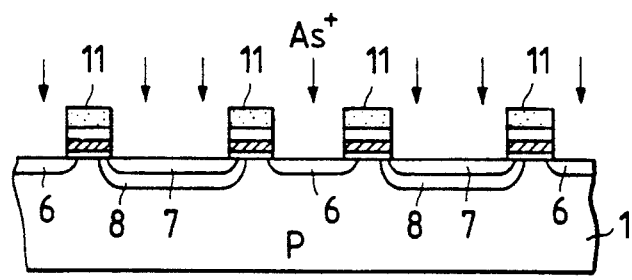
Figure 3C:
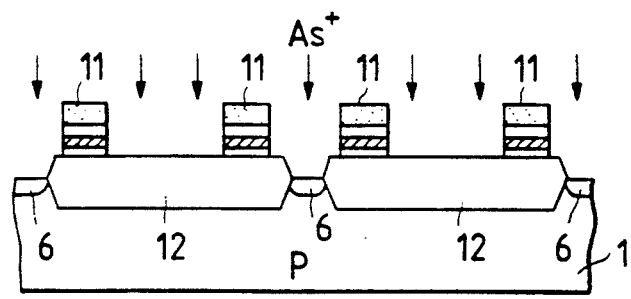
Figure 3D:
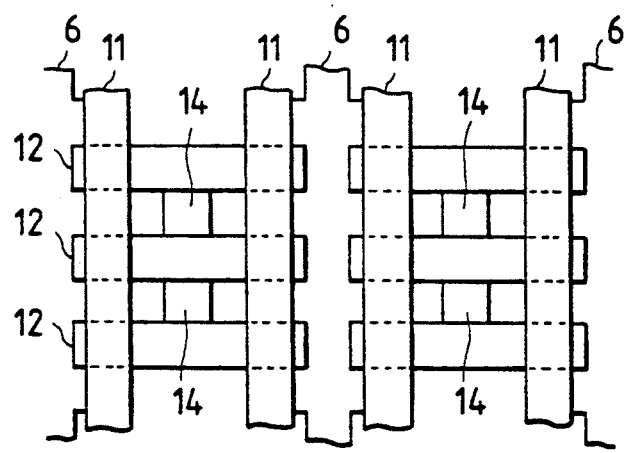

In FIG. 3(e), FIG. 3(f) which is a cross sectional view taken along the line F—F of FIG. 3(e) and FIG. 3(g) which is a cross sectional view taken along the line G—G of FIG. 3(e), the photoresist 13 is removed and arsenic (As+) is vertically ion-implanted into the source and the drain regions to form the source diffusion layer 6 and the drain diffusion layer 7.

In FIG. 3(h), the intervening insulating film 9 (not shown in FIG. 3(h)) such a silicon oxide film, etc., is grown and a desired contact hole 14 is formed therein.

Figure 4A:
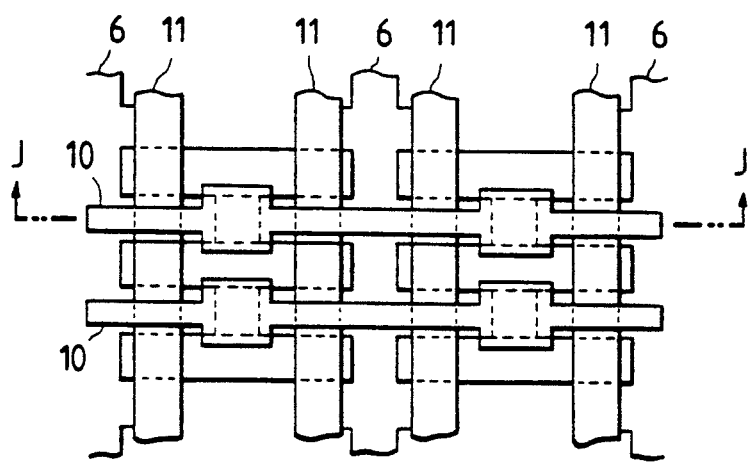
FIGS. 4(i) to 4(j) are explanatory views of a production method of a memory device using the M O N O S element according to the embodiment.
Figure 4B:
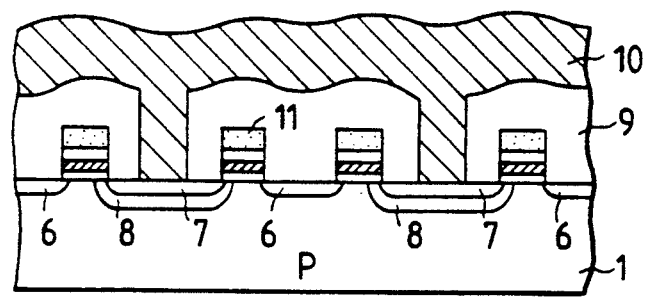

In FIG. 4(i) and FIG. 4(j) which is a cross sectional view taken along the line J—J of FIG. 4(i), a metal layer of Al—Si, etc., is formed on the intervening insulating film 9 and patterning is carried out by the photo-etching process to form a wiring such as a drain electrode 10 etc.

As explained above, a memory device in which M O N O S elements are connected in matrix is realized.

In the embodiment, although an N channel structured M O N O S element was explained, the present invention can be naturally applied to a P channel structured M O N O S element.

Further, the present invention can be applied to an element other than the M O N O S element. For example, the present invention can be applied to a non-volatile semiconductor memory in which a dielectric gate structure is constructed by tunnelling oxide film - Si cluster-containing oxide film (Si rich oxide film) - top oxide film - gate electrode and electric charges are held in the Si rich oxide film.

As apparent from the above description, according to the non-volatile semiconductor memory of the present invention, an outer diffusion layer having the same conductivity type impurity as that of a substrate and a higher impurity concentration than that of the substrate is caused to intervene between the drain diffusion layer and the substrate. Thus, the hot electrons and the hot holes can be effectively generated near the drain at the data writing and the data erasing. Therefore, since voltage to be applied to the gate electrode and the drain electrode can be set to a low level at the data writing and the data erasing by the increased injection ratio of the hot electrons and the hot holes into the gate structure, the voltage which acts on non-selective device is also reduced. Thus, the writing disturbance phenomenon and the error writing of the non-selective device can be avoided and the speed of writing and erasing is increased.

Further, when voltage is applied to a drain electrode, the depletion layer which is generated at the junction portion of the drain diffusion layer and the outer diffusion layer is not easily extended to the direction of the outer diffusion layer having a high impurity concentration. Thus, even in a short channel device, the source is not connected to the drain with a depletion layer and the generation of the punch through current can be prevented.

What is claimed is:

1. A non-volatile semiconductor memory, comprising:
    a semiconductor substrate;
    a gate structure provided on said substrate and including an insulating film comprising a tunnelling oxide layer having a thickness of 20 to 60 Å on the semiconductor substrate, a nitride layer having a thickness of 60 to 120 Å on the tunnelling oxide layer, and a top oxide layer having a thickness of 40 to 80 Å on the nitride layer, data being written into and read from said memory through charges stored in the nitride layer in said insulating film;
    a source diffusion layer and a drain diffusion layer provided in said semiconductor substrate partially underlying opposite sides of said gate structure, both of said source diffusion layer and said drain diffusion layer having an opposite conductivity type impurity to that of said substrate; and
    an outer diffusion layer provided between said drain diffusion layer and said substrate so as to produce an asymmetric arrangement of source and drain diffusions with respect to the gate structure, said outer diffusion layer having the same conductivity type impurity as that of said substrate and an impurity concentration higher than that of said substrate.

* * * * *

UNITED STATES PATENT AND TRADEMARK OFFICE
CERTIFICATE OF CORRECTION

PATENT NO. : 5,311,049
DATED : May 10, 1994
INVENTOR(S) : Masataka Tsuruta

It is certified that error appears in the above-indentified patent and that said Letters Patent is hereby corrected as shown below:

Column 1, line 19, "is" should read --is a--.

Column 1, line 22, "data in" should read --data in the--.

Column 1, line 43, delete "namely,".

Column 1, line 63, "different" should read --diffusion--.

Column 1, line 68, "Namely, 1" should read --Namely, 「1」--.

Column 2, line 5, "O" should read --「O」--.

Column 2, line 49, "disturbance" should read --writing disturbance--.

Column 5, line 2, "such a" should read --such as a--.

Signed and Sealed this

Twenty-seventh Day of September, 1994

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,311,049

DATED : May 10, 1994

INVENTOR(S) : Masataka Tsuruta

It is certified that error appears in the above-identified patent and that said Letters Patent is hereby corrected as shown below:

Column 2 line 46, "view" should read --in view--.

Signed and Sealed this

Eighteenth Day of October, 1994

*Attest:*

BRUCE LEHMAN

*Attesting Officer*   *Commissioner of Patents and Trademarks*